United States Patent
Machida et al.

(10) Patent No.: US 6,980,013 B2
(45) Date of Patent: Dec. 27, 2005

(54) PROBE CARD

(75) Inventors: Kazumichi Machida, Takarazuka (JP); Atsuo Urata, Ibaraki (JP); Teppei Kimura, Kobe (JP)

(73) Assignee: Nihon Denshizairyo Kabushiki Kaisha, Amagasaki (JP)

( * ) Notice: Subject to any disclaimer, the term of this patent is extended or adjusted under 35 U.S.C. 154(b) by 0 days.

(21) Appl. No.: 10/919,398

(22) Filed: Aug. 17, 2004

(65) Prior Publication Data
US 2005/0151547 A1    Jul. 14, 2005

(30) Foreign Application Priority Data
Jan. 9, 2004  (JP) .............................. 2004-003626

(51) Int. Cl.[7] .......................................... G01R 31/02
(52) U.S. Cl. .................. 324/754; 324/756; 324/758
(58) Field of Search ................................ 324/750–765

(56) References Cited

U.S. PATENT DOCUMENTS

| | | | | |
|---|---|---|---|---|
| 4,788,496 | A | * | 11/1988 | Maelzer et al. ............. 324/754 |
| 4,963,822 | A | * | 10/1990 | Prokopp ...................... 324/758 |
| 5,525,911 | A | * | 6/1996 | Marumo et al. ............. 324/754 |
| 5,644,249 | A | * | 7/1997 | Kister ......................... 324/762 |
| 2002/0024347 | A1 | * | 2/2002 | Felici et al. ................. 324/754 |
| 2004/0124862 | A1 | * | 7/2004 | Sugawara .................... 324/754 |

FOREIGN PATENT DOCUMENTS

JP   11-344509   * 12/1999   .......... G01R 1/073

* cited by examiner

*Primary Examiner*—Vinh Nguyen
*Assistant Examiner*—Emily Y Chan
(74) *Attorney, Agent, or Firm*—Armstrong, Kratz, Quintos, Hanson & Brooks, LLP (57) ABSTRACT

A probe card including rectilinear probes; a guide base plate having an insulating property, in which a plurality of guide holes are formed through which the probes are inserted in a freely movable manner and a length of a guide hole is shorter than a length of a probe; and a plurality of sheet members having an insulating property, disposed above the guide base plate facing the plate, and laminated one on another with a spacing therebetween so as not to be in contact with one another. The tail ends of some of the probes can be brought into contact with the electrode pads on a lowest sheet member, and the tail ends of the other probes penetrate through the lowest sheet member so as to be enabled to be in contact with electrode pads on other sheet members.

7 Claims, 7 Drawing Sheets

PROBE CARD

BACKGROUND OF THE INVENTION

1. Field of the Invention

The present invention relates to a probe card used in measuring electric characteristics of a measurement objective.

2. Description of the Related Art

As a probe card of this kind, there has been available one including a base plate and probes each having a curved portion and attached to the base plate (see Patent literature 1). The probe card is used in a way such that the distal end of a probe is overdriven on an electrode as a measurement objective in contact therewith to bend the curved portion of the probe, whereby not only is a predetermined contact pressure necessary for measurement against the electrode as a measurement objective obtained, but also the distal end is slid on a surface of the electrode as a measurement objective to scrape an oxide film attached on the surface for ensuring stable contact with the electrode as a measuring objective.

Patent literature 1: JP-A No. 2003-215163.

The probes have been disposed at a narrower pitch progressively toward higher complexity in an integrated circuit, leading to a possibility that a curved portion of a probe is brought into contact with the next probe. Hence, it has been difficult to dispose the probes at the narrow pitch.

If rectilinear probes are employed, it is naturally easier to dispose the probes at a narrower pitch, whereas a rectilinear probe cannot divert away an overdriven load, in terms of construction, which could be successfully realized by the probe with a curved portion. Therefore, a rectilinear probe is easily broken and has difficulty obtaining a contact pressure necessary for measurement. Moreover, because it is difficult to scrape an oxide film on an electrode as a measurement objective by sliding the probe sideways on a surface of the electrode, the probe again has difficulty ensuring a stable contact with the electrode as a measurement objective.

If probes are disposed at a narrow pitch, great congestion arises of electrodes and wiring patterns on a base plate connected electrically to the probes, making placement thereof difficult. In this regard as well, it is difficult to dispose the probes at a narrow pitch.

SUMMARY OF THE INVENTION

It is an object of the present invention to provide a probe card capable of a stable contact thereof with electrodes on a measurement objective and of arranging probes at a narrow pitch so as to be adapted for high complexity in an integrated circuit as the measurement objective.

In order to solve the above problems, a probe card of the present invention includes: plural rectilinear probes; a guide base plate having an insulating property, in which plural guide holes are formed through which the probes are inserted in a freely movable manner and a length of a guide hole is shorter than a length of a probe; and plural sheet members of an insulating property, disposed above the guide base plate facing the plate, and laminated one on another with a spacing therebetween so as not to be in contact with one another, wherein electrode pads are provided on a surface of each of the sheet members, the tail ends of some of the probes projecting out from the upper side of the guide holes can be brought into contact with the electrode pads on the sheet member in the lowermost layer of the plural sheet members, and the tail ends of the other probes projecting out from the upper side of the base holes penetrate through the sheet member in the lowest layer or sheet members including the sheet member in the lowest layer so as to be enabled to be in contact with electrode pads on sheet members above the sheet member in the lowest layer.

It is preferable for a tail end of a probe to be sharpened. A sheet member is preferably a liquid crystal polymer or a silicon film in a mesh state or a fibrous state.

Wiring patterns are provided in the interior of the guide base plate, extend to the guide holes and can be brought into contact with the probes.

In a case where plural guide base plates are employed, the guide base plates are laminated one on another.

The guide holes of the guide base plates are preferably formed obliquely relative to a vertical direction.

In one embodiment of the present invention, probes move within respective guide holes when the distal ends of the probes are brought into contact with corresponding electrodes as a measurement objective. Then, the tail ends of some of the probes are brought into contact with electrode pads on the sheet member in the lowermost layer, while on the other hand, the tail ends of the other probes penetrate the lowermost sheet member or sheet members including the sheet member in the lowest layer so as to be into contact with electrode pads on sheet members above the sheet member in the lowest layer. Hence, even if overdriving is effected using a rectilinear probe, the probe is brought into contact with an electrode and bent, or the probe penetrates through sheet members, thereby enabling not only a load caused by the overdriving to be absorbed but also a predetermined contact pressure with an electrode as a measurement objective to be secured. That is, because a stable contact with an electrode as a measurement objective can be secured by use of a rectilinear probe, it is possible to dispose the probes at a narrow pitch with the result that a high complexity in an integrated circuit as a measurement objective can be dealt with. In addition, because the electrode pads are dispersed over surfaces of the sheet members, it is possible to prevent congestion of electrode pads and wiring patterns accompanying that of the electrode pads, which would otherwise occur. In this regard as well, it becomes easier to dispose probes at a narrow pitch, thereby enabling adaptation for a higher complexity in an integrated circuit as a measurement objective.

The tail ends of probes may be sharpened; therefore, the probes are easy to stick into a sheet member or sheet members.

A sheet member may be made of a liquid crystal polymer or a silicone film in a mesh state or a fibrous state. Accordingly, because the tail ends of the probes are easier to stick into the sheet member or sheet members.

Because wiring patterns may be preferably provided in the interior of a guide base plate, there arises no chance that the guide base plate is congested with electrode pads and wiring patterns provided together with the electrode pads in company with provision of the probes at a narrower pitch, although the base plate would be otherwise congested in a conventional case, thereby disabling the probes to be provided. Therefore, it is easier to dispose the probes at a narrow pitch, thereby enabling adaptation for a high complexity in an integrated circuit as a measurement objective.

A plurality of guide base plates may be used.

The probes may be inserted in the guide hole are in an obliquely inclined state. Hence, the distal end of a probe is brought into oblique contact with an electrode as a measurement objective and slid sideways on the electrode. Hence, an oxide film attached on the electrode can be scraped; therefore, it is possible to ensure a stabler contact with an electrode as a measurement objective.

BRIEF DESCRIPTION OF THE DRAWINGS

FIGS. 3(a) and 3(b) are views showing a guide base plate of the probe card, wherein

FIGS. 4(a) and 4(b) are views showing a reinforcing member for the probe card, wherein FIG. 4 (a) is a schematic plan view, and FIG. 4(b) is a schematic sectional view;

FIGS. 5(a) and 5(b) are views showing a sheet member of the probe card, wherein

DESCRIPTION OF THE PREFERRED EMBODIMENTS

Description will be given of embodiments of the present invention below.

Embodiment 1

Figure 1:
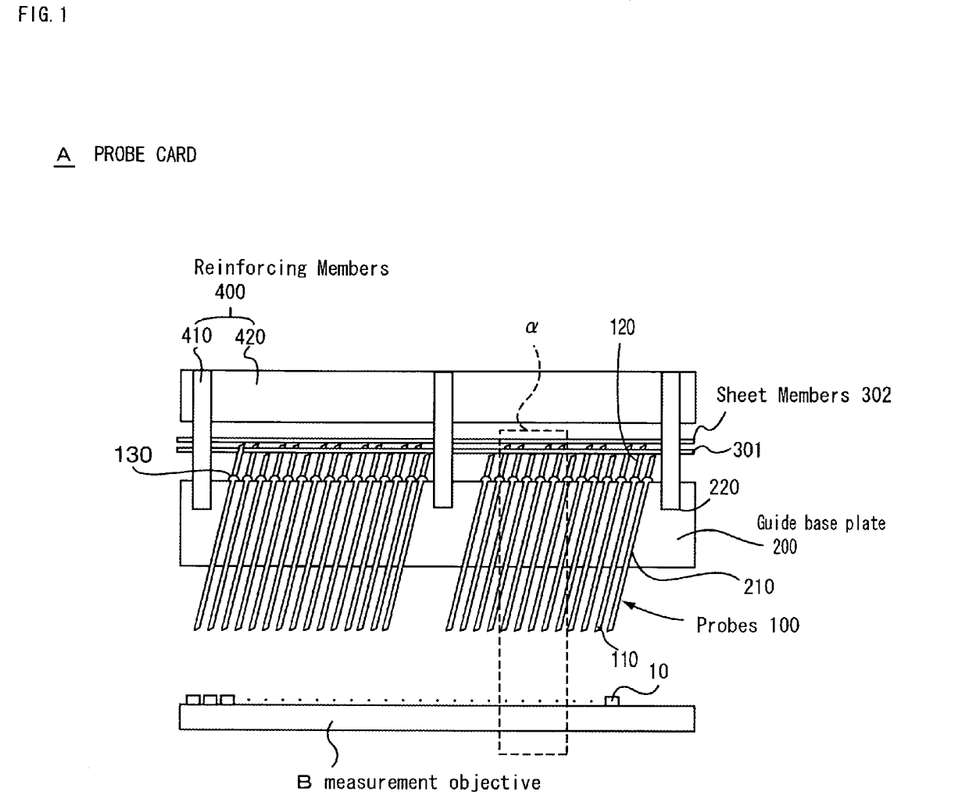
FIG. 1 is a schematic sectional view of a probe card related to a first embodiment of the present invention.

First of all, description will be given of a probe card related a first embodiment of the present invention with reference to the accompanying drawings. FIG. 1 is a schematic sectional view of a probe card related to the first embodiment of the present invention, FIG. 2 is an enlarged view of an α portion of the probe card, FIGS. 3(a) and 3(b) are views showing a guide base plate of the probe card, wherein FIG. 3(a) is a schematic plan view and FIG. 3(b) is a schematic sectional view, FIGS. 4(a) and 4(b) are views showing a reinforcing member for the probe card, wherein FIG. 4(a) is a schematic plan view, and FIG. 4(b) is a schematic sectional view, FIGS. 5(a) and 5(b) are views showing a sheet member of the probe card, wherein FIG. 5(a) is a schematic plan view and FIG. 5(b) is a schematic sectional view.

Figure 2:
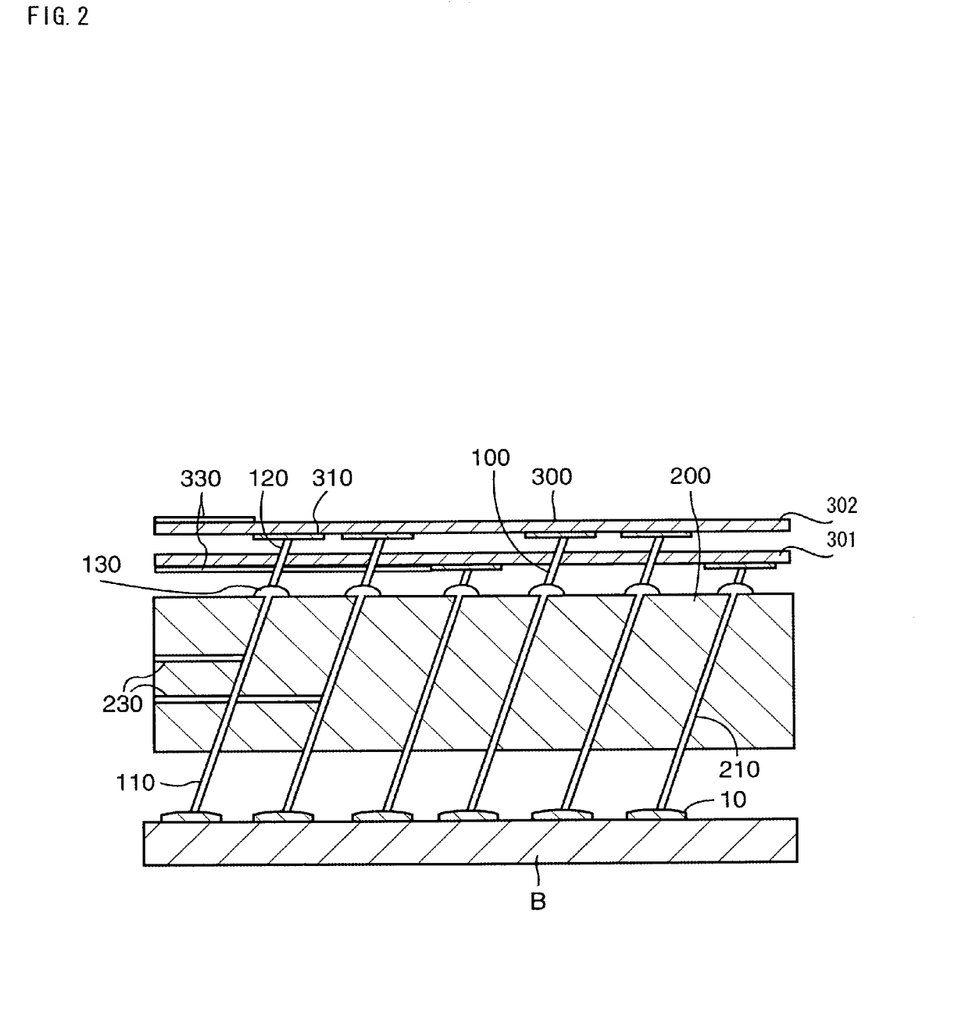
FIG. 2 is an enlarged view of an a portion of the probe card.
Figure 3:
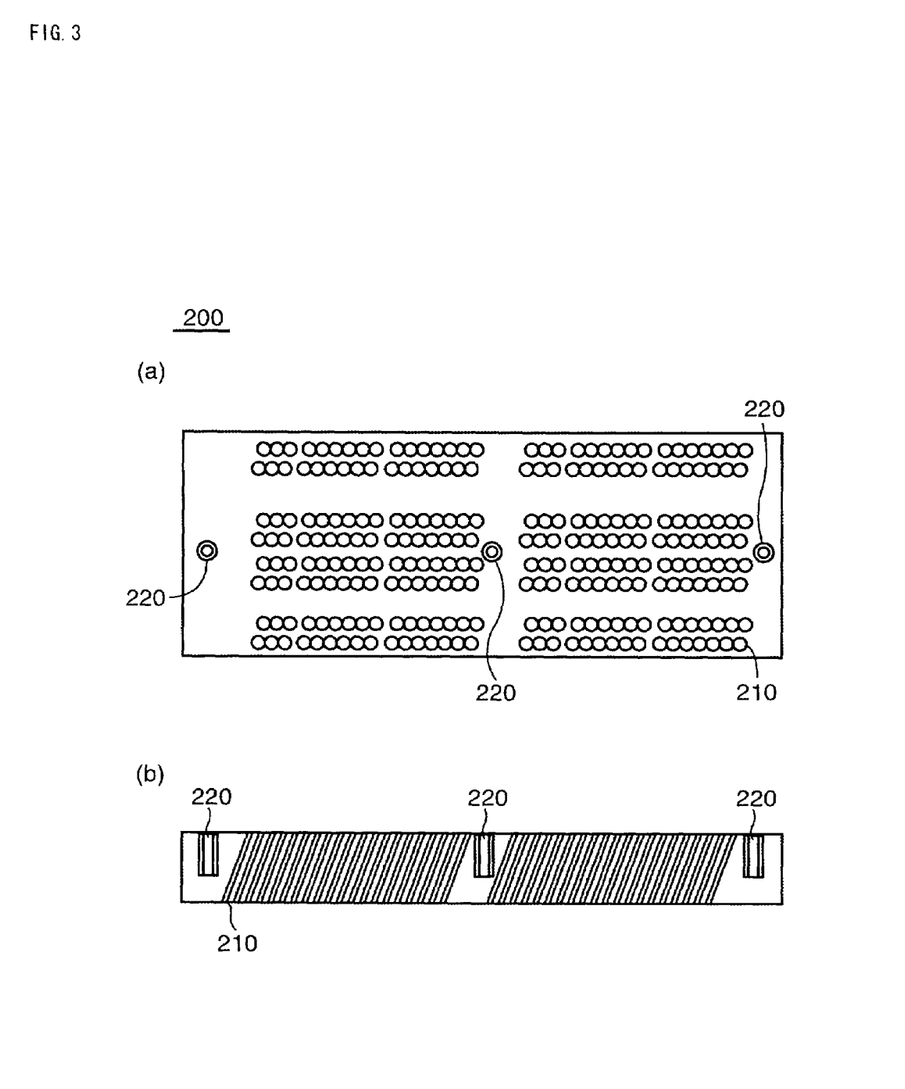
FIG. 3(a) is a schematic plan view and FIG. 3(b) is a schematic sectional view.

The probe card A shown in FIGS. 1 and 2 includes a plurality of rectilinear probes 100; a guide base plate 200 in which a plurality of guide holes 210 are provided into which the probes 100 are inserted in a freely movable manner; and two insulative sheet members 301 and 302, provided above the guide base plate 200, and disposed one on the other with a spacing so as not to be in contact with each other. Detailed description will be given of portions thereof below.

The probe 100 is, as shown in FIGS. 1 and 2, made of an electroconductive material in a cylindrical or band-like shape. The probes 100 each are in the range of from 300 $\mu$m to 20 mm in length, and the distal end 110 and the tail end 120 of a probe 100 both project out, respectively, from the lower side and upper side of the corresponding guide hole 210 in a state in which the probe is inserted into the guide hole of the guide base plate 200. The probes 100 are attached to the guide holes 210 on the upper surface of the guide base plate 200 using an elastic resin 130 in a freely movable manner. In this way, the probes 100 are provided with slip-off proofs. Note that the probes 100 are inserted into the respective guide holes 210 and disposed at a pitch in the range of from 30 to 100 $\mu$m.

The distal end 110 of a probe 100 is a contact portion contactable with the corresponding electrode 10 as a measurement objective B, while on the other hand, the tail end 120 thereof is a connecting portion contactable with a corresponding electrode pad 310 on the sheet member 301 or 302. Some of the probes 100 are contactable, at the tail ends 120 thereof, with corresponding electrode pads 310 on the sheet member 301. On the other hand, the other probes 100 penetrate through the sheet member 301 and, at the tail ends 120 thereof, are contactable with electrode pads 310 on the sheet member 302.

The guide base plate 200 is, as shown in FIGS. 1 and 3(a) and 3(b), made of a silicon base plate having an insulating property. The guide base plate 200 has a thickness in the range of from 500 to 1200 $\mu$m. The guide holes 210 are formed in the guide base plate 200 by anisotropic etching with a induction coupling plasma (IPC) method at a pitch in the range of from 70 to 100 $\mu$m obliquely relative to a vertical direction. A shape of a guide hole 210 is properly selected so as to be adapted for a shape of a probe 100 and a diameter thereof is slightly larger than a diameter of the probe 100. A length of a guide hole 210 is set so as to be shorter than that of a probe 100. Note that mounting holes 220 that are internally threaded holes, into which support poles 410 for the reinforcing members 400 described later are inserted, are provided at both end portions and the central portion of the guide base plate 200 in the upper surface thereof.

The wiring patterns 230 and circuit elements (not shown) connected electrically to the wiring patterns 230 are provided in the interior of the guide base plate 200. One end of a wiring pattern 230 is guided by a guide hole 210 to expose from the guide hole 210 and thereby contactable with a corresponding probe 100, while on the other hand, the other end thereof is connected electrically to an external electrode not shown provided on a surface of the guide base plate 200. That is, the wiring pattern 230 is connected electrically to a power supply outside the figure through the external electrode.

A circuit element is an element necessary to conduct electric measurement with a probe and, in this case, includes a capacitor functioning as a so-called pass capacitor and a circuit element functioning as a BOST (built out self test) circuit assisting a test (that is, measurement of an electric characteristic of a measurement objective B). The capacitor functions to improve high frequency characteristics. The circuit element functioning as a BOST circuit that alters its function according to contents of a test on a measurement objective B.

Figure 4:
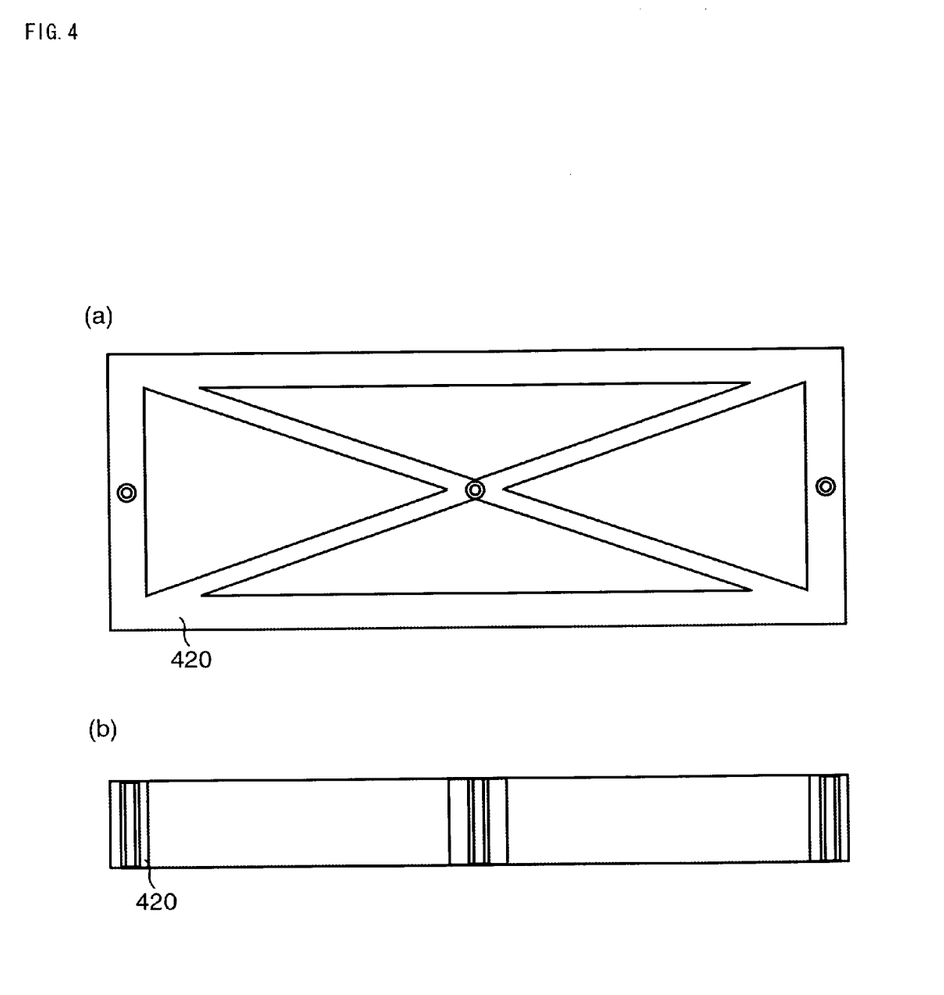

The reinforcing member 400, as shown in FIGS. 1 and 4, includes: support poles 410 inserted in mounting holes 220 of the guide base plate 200; and a frame 420 supported by the support poles 410. The plurality of sheet members 301 and 302 are, as shown in FIG. 2, mounted to the support poles 410 disposed one on the other in a state where the plural sheet members 301 and 302 are not in contact with each other. In this way, the sheet members 301 and 302 are disposed above the guide base plate 200.

The frame 420 is made of a material such as molybdenum having a thermal expansion coefficient close to that of the guide base plate 200 made of silicon. With a frame 420 having such a thermal expansion coefficient adopted, the frame 420 matches a measurement objective B in thermal expansion coefficient.

Figure 5:
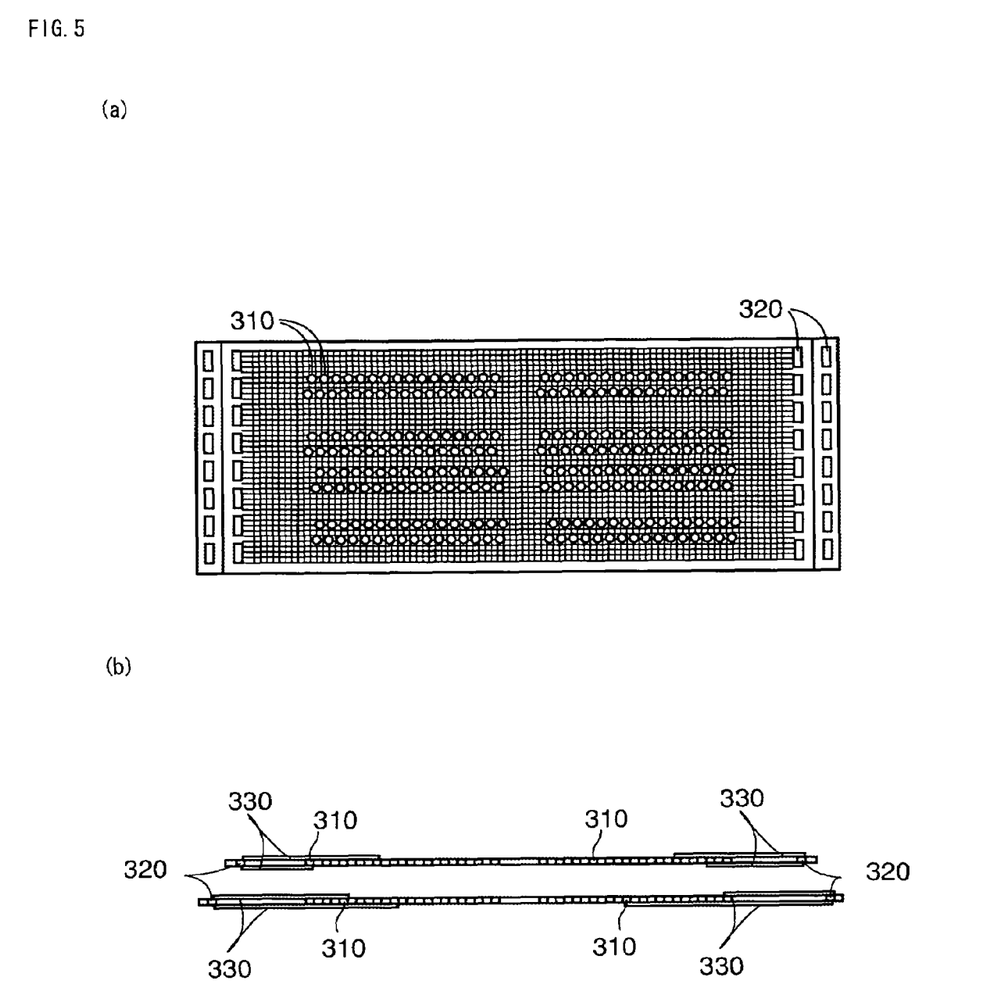
FIG. 5(a) is a schematic plan view and FIG. 5(b) is a schematic sectional view.

Used as the sheet members 301 and 302 is, as shown in FIGS. 2 and 5(*a*) and 5(*b*), a liquid crystal polymer in a mesh or fibrous state (LCP-Mesh) having apertures each large enough for a probe 100 to penetrate therethrough. The electrode pads 310 with which the tail ends 120 of the probes 100 is brought into contact, and the wiring patterns 330 connecting the electrode pads 310 and the external electrode 320 electrically are provided on surfaces of the sheet members 301 and 302. That is, the tail ends 120 of some of the probes 100 are connected electrically to the external electrode 320 through the wiring patterns 330 in a state being in contact with the electrode pads 310 of the sheet member 301. The tail ends of the other probes 100 are connected electrically to the external electrode 320 through the wiring patterns 330 such that where the tail ends 120 thereof penetrate through the sheet member 301 and are brought into contact with the electrode pads 310 of the sheet member 302. Thus, the electrode pads 310 are dispersed over surfaces of the sheet members 301 and 302, so that the wiring patterns 330 can be disposed in high density as the probes 100 are disposed at a narrower pitch. Note that the external electrode 320 is connected electrically to a measuring instrument.

Such a probe card A is assembled in this way: First of all, the probes 100 are inserted into the guide holes 210 of the guide base plate 200 and attached to the guide base plate 200 with the elastic resin 130. Then, the probes 100 are, as shown in FIG. 1, inclined obliquely relative to a vertical direction. Thereafter, the support poles 410 are inserted into the mounting holes 220 for attachment. Then, the two sheet members 300 are attached to the support poles 410 and disposed one on the other so as not to be in contact with each other while facing the guide base plate 200. The frame 420 is then attached to the poles 410.

The probe card A with such a construction is mounted to a prober of a measuring instrument by the frame 420 thereof and used in measurement of electric characteristics of a measurement objective B. Detailed description will be given of a usage method thereof below.

First of all, a driving apparatus of the prober is activated to move the guide base plate 200 and a measurement objective B relatively toward each other. With the movement, the distal end 110 of a probe 100 is brought into contact with an electrode 10 of the measurement objective B. Thereafter, the guide base plate 200 and the measurement objective B are moved closer to each other so as to cause the distal end 110 of the probe 100 to press against the electrode 10 of the measurement objective B (that is, overdriven).

In the course of this operation, some of the probes 100 move through the guide holes 210 of the guide base plate 200 and the tail ends thereof are brought into contact with the electrode pads 310 on the sheet member 301. On the other hand, the other probes 100 move through the guide holes 210 of the guide base plate 200 and the tail ends thereof penetrate through the sheet member 301 and are brought into contact with the electrode pads 310 on the sheet member 302. With such workings exerted, not only is a shock caused by the overdriving absorbed, but a predetermined contact pressure is secured between the distal ends 110 of probes 100 and the corresponding electrodes 10 of the measurement objective B. In this case, the distal end 110 of a probe 100 is brought into contact with the electrode 10 of the measurement objective B obliquely relative to a surface of the electrode 10 and slides sideways on the surface thereof while scraping an attached oxide film thereon. By scraping the attached oxide film thereon, a stable contact is secured between the distal end 110 of a probe 100 and the corresponding electrode 10 of the measurement objective B. Then, measurement is performed of the measurement objective B with the measuring instrument.

In a case where such a probe card A is employed, despite rectilinear probes 100 employed, not only can a predetermined contact pressure be secured between the distal end 110 of a probe 100 and a corresponding electrode 10 of the measurement objective B, but an oxide film attached on a surface of the electrode 10 of the measurement objective B can also be scraped to secure stable contact between the distal end 110 of the probe 100 and the electrode 10 of the measurement objective B. That is, because rectilinear probes that are disposed at a narrow pitch with ease can be employed, adaptation can, as a result, be effected for a high complexity in an intergrated circuit.

Embodiment 2

Figure 6:
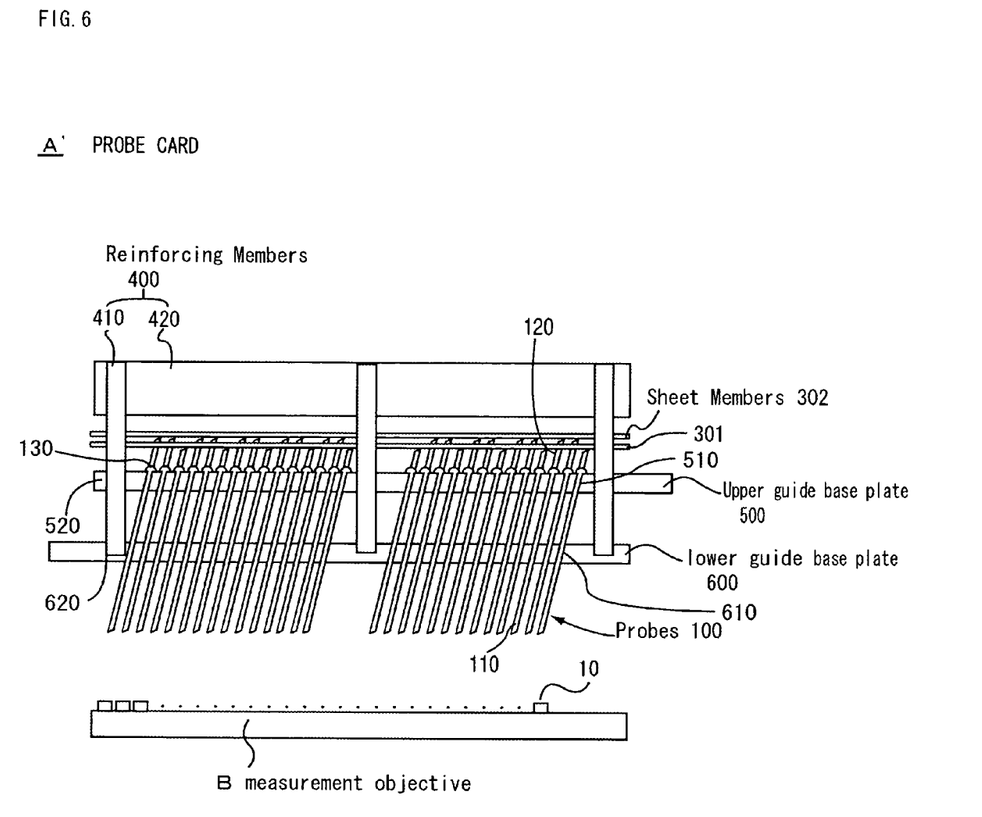
FIG. 6 is a schematic sectional view of a probe card related to a second embodiment of the present invention.
Figure 7:
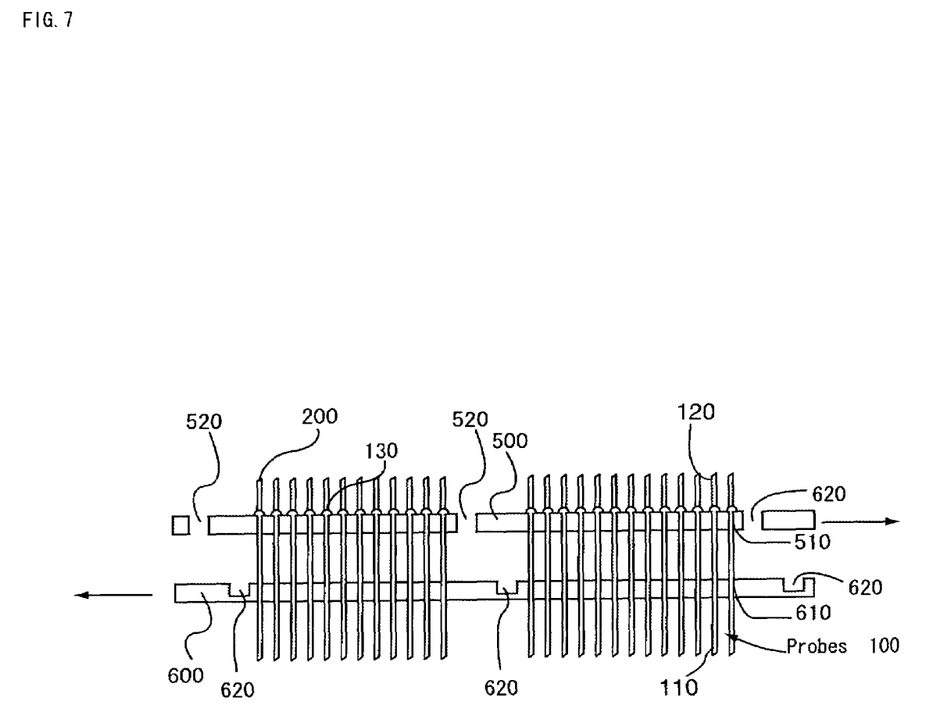
FIG. 7 is a schematic sectional view showing an attaching process for probes of the prove card.

Description will be given of a probe card related to the second embodiment of the present invention with reference to the accompanying drawings. FIG. 6 is a schematic sectional view of a probe card related to the second embodiment of the present invention and FIG. 7 is a schematic sectional view showing an attaching process for probes of the probe card.

The probe card A' shown in FIG. 6 is of almost the same construction as the probe card A. The probe A' is different from the probe card A in that an upper guide base plate 500 and a lower guide plate 600 are employed instead of the guide base plate 200. Therefore, detailed description will be given of different portions of the construction, but no description of duplicated portions is given. Note that the same symbols as in the first embodiment are used to indicate the same members in the second embodiment.

A silicon base plate similar to the guide base plate 200 is employed as the upper guide base plate 500. The upper guide base plate 500 is different from the guide base plate 200 in that a thickness of the upper guide plate 500 is in the range of 100 to 6 mm and thinner than the guide base plate 200. Therefore, none of wiring patterns and circuit elements is provided in the interior of the upper guide base plate 500. Upper guide holes 510 of the upper guide base plate 500 are formed vertically at a pitch in the range of from 70 to 100 μm. Mounting holes 520 each of which is an internally threaded through hole, into which the support poles 410 of the reinforcing members 400 are inserted, are formed at both end portions and a central portion of a surface of the upper guide base plate 500. Note that the probes 100 are attached to the upper surface of the upper guide base plate 500 with the elastic resin 130 so as to move through the guide holes 510 and 610 in a freely movable manner.

Used as the lower guide base plate 600 is a silicon base plate almost same as the upper guide base plate 500. The lower guide base plate 600 is different from the upper guide base plate 500 in that the mounting holes 620 each are not a through hole but an internally threaded hole with a bottom and that the mounting holes 620 are provided at positions shifted in position from the corresponding upper guide holes 510 of the upper guide base plate 500 while not aligning with a vertical line as shown in FIG. 7.

Such a prove card A' is assembled in the following way. First of all, as shown in FIG. 7, the upper guide base plate 500 and the lower guide base plate 600 are positioned so as to face each other. In this step, the upper guide holes 510 and the lower guide holes 610 are positioned so as to be on vertical lines. Thereafter, the probes 100 are inserted into the upper guide holes 510 and the lower guide holes 610 and attached to the upper guide base plate 500 with the elastic resin 130. Then, the upper guide base plate 500 is moved horizontally in a direction of an arrow symbol of FIG. 7 (in a rightward direction) while on the other hand, the lower guide base plate 600 is moved horizontally in a direction of an arrow symbol of FIG. 7 (in a leftward direction). Thereafter, the mounting holes 520 and mounting holes 620 for the support poles 410 are moved so as to be aligned with each other in regard to a vertical line. The probes 100 are, as shown in FIG. 6, in a state of being inclined obliquely relative to a vertical direction. Thereafter, the support poles 410 are inserted into the mounting holes 520 and the mounting holes 620. The two sheets members 300 are disposed one on the other so as not to be in contact with each other and attached to the support poles 410 so as to face the upper guide base plate 500. Then, the frame 420 is attached to the support poles 410.

The probe card A' thus assembled is mounted to the prober of a measuring instrument with the frame 420 and used to measure electric characteristics of a measurement objective. Detailed description will be given of a usage method thereof.

First of all, the driving apparatus of the prober is activated and the guide base plate 200 and the measurement objective B are moved relatively toward each other. By the movement, the distal ends 110 of the probes 100 are brought into contact with the electrodes 10 of the measurement objective B. Thereafter, the guide base plate 200 is moved closer to the measurement objective B to press the distal ends 110 of the probes 100 against the electrodes 10 of the measurement objective B (that is overdriven).

In the course of a series of operations, some of the probes 100 move through the upper guide holes 510 of the upper guide base plate 500 and the lower guide holes 610 of the lower guide base plate 600 to cause the tail ends 120 of the probes 100 to be in contact with the electrode pads 310 of the sheet member 301. On the other hand, the other probes 100 move through the upper guide holes 510 of the upper guide base plate 500 and the lower guide holes 610 of the lower guide base 600, and the tail ends 120 of the probes 100 penetrate through the sheet member 301 and are brought into contact with the electrode pads 310 on the sheet member 302. As a result of such operations, not only is a shock resulting from the overdriving absorbed, but a predetermined contact pressure is secured between the distal ends 110 of the probes 100 and the electrodes 10 of the measurement objective B. In this state, the distal ends 110 of the probes 100 are brought into oblique contact with surfaces of the electrodes 10 of the measurement objective B and slide sideways on the surfaces of the electrodes 10 while scraping oxide films attached thereon. By doing so, a stable contact is secured between the distal ends 110 of the probes 100 and the electrodes 10 of the measurement objective B. Then, measurement is performed of the measurement objective B with the measuring instrument.

In a case where such a probe card A' is employed, despite the rectilinear probes 100 employed, not only can a predetermined contact pressure be secured between the distal ends 110 of the probes 100 and the electrodes 10 of the measurement objective B, but also an oxide film attached on the surfaces of the electrodes 10 of the measurement objective B is scraped to be enabled a stable contact between the distal ends 110 of the probes 110 and the electrodes 10 of the measurement objective B to secured. That is, because rectilinear probes that are easy to be disposed at a narrow pitch can be used, a high complexity in an integrated circuit, as a result, can be adapted for.

Any change in design of the probe cards A and A' may be conducted without causing any inconvenience, as far as the probe cards A and A' include: plural rectilinear probes; and a guide base plate or guide base plates of an insulating property, in or in each of, which plural guide holes into which the probes are inserted in a freely movable manner are formed and a length of a guide hole is shorter than a length of a probe; and plural sheet members, disposed above the guide plate, and disposed one on the other with a spacing so as not to be in contact with each other, wherein electrode pads are provided on each of the sheet members and some of the probes, at the tail ends projecting out from the upper side of the guide holes or the upper guide holes, can be brought in contact with corresponding electrode pads of the sheet member in the lowest layer of the sheet members, while on the other hand, the other probes 100 penetrate through the sheet member in the lowest layer or sheet members including the sheet member in the lowest layer, at the tail ends thereof projecting out from the upper side of the guide holes or the upper guide holes, so as to be enabled to be in contact with electrode pads on sheet members above the sheet member in the lowest layer.

Therefore, while the probes 100 each are of a cylindrical or band-like shape in the above description, a shape of each of the probes 100 is arbitrary. Furthermore, while in the above description, an elastic resin 130 is employed as a slip-off proof means of each of the probes 100, any material may be employed as far as a similar function can be exerted.

While in the above description, the guide base plate 200 is a silicon base plate, the guide base plate is not specifically limited to the silicon base plate. While in the above description, the guide holes 210 are formed obliquely relative to a vertical line, they may be formed in conformity with a vertical line. While in the above description, wiring patterns 23 and circuit elements are provided in the interior of the guide base plate 200, the presence or absence thereof is arbitrary. Note that the wiring patterns 230 can also naturally used as a line with which transmission and reception of a test signal are conducted. In this case, the electrode pads 310 can be used only as receiving members.

A silicon base plate is not required to be used as the upper guide base plate 500 and the lower guide base plate 600, and any of other base plates can be used as far as a similar function to that of silicon base plate can be exerted. While in the above description, no wiring pattern is provided in the interior of the upper guide base plate 500 or the lower guide base plate 600, wiring patterns can be naturally provided in the interior thereof if the plates have a thickness of a predetermined value or more. Note that in the description of the second embodiment, employed are two guide base plates including the upper guide base plate 500 and the lower guide base plate 600, needless to say that it is possible to employ three or more guide base plates disposed one on another.

While in the above description, the upper guide holes 510 and the lower guide holes 610 are formed along a vertical direction, it is naturally possible to form the guide holes obliquely relative to a vertical direction as in the guide holes 210.

While in the above description the sheet member 300 is liquid crystal polymer in a mesh or fibrous state, the sheet member 300 is not limited to the liquid crystal polymer, but any material may be used instead as far as a similar function can be exerted. For example, a silicon film or the like can replace the liquid crystal polymer. In this case, the tail ends 120 of the probes 100 are preferably sharpened. While in the above description, the two sheet members 300 are employed, needless to say that three or more sheet members can be employed laminating them so as not to be in contact with one another.

What is claimed is:

1. A probe card comprising:

first and second rectilinear probes;

a guide base plate having an insulating property, in which a plurality of guide holes are formed through which the first and second probes are inserted in a freely movable manner; and a first sheet member having flexible and insulating properties and disposed parallel to the guide base plate, wherein a first electrode pad is provided on a surface of the first sheet member and an end portion of the first probe projecting out of the guide hole is contactable with the first electrode pad; and a second sheet member having flexible and insulating properties and disposed parallel to and spaced apart from the first sheet member, wherein a second electrode pad is provided on a surface of the second sheet member and an end portion of the second probe projecting out of the guide hole and penetrating through said first sheet member is contactable with the second electrode pad.

2. A probe card according to claim 1, wherein a tail end of a probe is sharpened.

3. A probe card according to claim 1, wherein a sheet member is a liquid crystal polymer or a silicon film in a mesh state or a fibrous state.

4. A probe card according to claim 1, wherein wiring patterns are provided in the interior of the guide base plate, extend to the guide holes and can be brought into contact with the probes.

5. A probe card according to claim 1, wherein plural guide base plates are employed and are laminated one on another.

6. A probe card according to claim 1 or 5, wherein the guide holes of the guide base plate or plates are formed obliquely relative to a vertical direction.

7. A probe card according to claim 5, wherein the guide holes of the guide base plate or plates are formed obliquely relative to a vertical direction.

* * * * *